(12) United States Patent
Shimizu et al.

(10) Patent No.: US 11,450,745 B2
(45) Date of Patent: Sep. 20, 2022

(54) SEMICONDUCTOR DEVICE AND METHOD FOR MANUFACTURING THE SAME

(71) Applicant: Kabushiki Kaisha Toshiba, Minato-ku (JP)

(72) Inventors: Tatsuo Shimizu, Shinagawa (JP); Johji Nishio, Machida (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 101 days.

(21) Appl. No.: 16/782,826

(22) Filed: Feb. 5, 2020

(65) Prior Publication Data

US 2020/0176571 A1 Jun. 4, 2020

Related U.S. Application Data

(62) Division of application No. 15/252,493, filed on Aug. 31, 2016, now abandoned.

(30) Foreign Application Priority Data

Sep. 11, 2015 (JP) .................................. 2015-179037

(51) Int. Cl.
| | |
|---|---|
| *H01L 29/16* | (2006.01) |
| *H01L 29/04* | (2006.01) |
| *H01L 29/167* | (2006.01) |
| *H01L 29/49* | (2006.01) |
| *H01L 21/04* | (2006.01) |
| *H01L 29/66* | (2006.01) |
| *H01L 29/739* | (2006.01) |
| *H01L 29/78* | (2006.01) |

(52) U.S. Cl.
CPC ........ *H01L 29/1608* (2013.01); *H01L 21/049* (2013.01); *H01L 29/045* (2013.01); *H01L 29/167* (2013.01); *H01L 29/4966* (2013.01); *H01L 29/66068* (2013.01); *H01L 29/7395* (2013.01); *H01L 29/7802* (2013.01); *H01L 29/7813* (2013.01); *H01L 29/7397* (2013.01)

(58) Field of Classification Search
None
See application file for complete search history.

(56) References Cited

U.S. PATENT DOCUMENTS

| | | | |
|---|---|---|---|
| 4,623,425 | A | 11/1986 | Suzuki et al. |
| 9,601,582 | B2 | 3/2017 | Nakano |

(Continued)

FOREIGN PATENT DOCUMENTS

| | | |
|---|---|---|
| JP | 59-203799 A | 11/1984 |
| JP | 04-139014 A | 5/1992 |

(Continued)

OTHER PUBLICATIONS

S. Tanimoto, et al., "Toward a better understanding of Ni$_2$Si-based contact on SiC," ECSCRM2010 abstract, (2010) p. 152.

*Primary Examiner* — Abul Kalam
(74) *Attorney, Agent, or Firm* — Oblon, McClelland, Maier & Neustadt, L.L.P.

(57) ABSTRACT

A semiconductor device according to embodiments includes a p-type SiC region, a gate insulating film disposed on the p-type SiC region, and a gate electrode disposed on the gate insulating film and including a p-type impurity and 3C—SiC.

12 Claims, 15 Drawing Sheets

(56) References Cited

U.S. PATENT DOCUMENTS

| | | | |
|---|---|---|---|
| 2003/0227061 A1* | 12/2003 | Yokogawa | H01L 29/7828 257/379 |
| 2005/0012143 A1 | 1/2005 | Tanaka et al. | |
| 2008/0197407 A1* | 8/2008 | Challa | H01L 29/66734 257/330 |
| 2010/0314626 A1* | 12/2010 | Harada | H01L 21/02658 257/77 |
| 2011/0017998 A1 | 1/2011 | Nakano | |
| 2012/0228631 A1 | 9/2012 | Kono | |
| 2014/0014972 A1 | 1/2014 | Nakano et al. | |
| 2014/0042462 A1 | 2/2014 | Tsuchiya | |
| 2016/0203972 A1 | 7/2016 | Sundaram | |
| 2017/0077260 A1 | 3/2017 | Shimizu et al. | |
| 2017/0077299 A1 | 3/2017 | Shimizu et al. | |
| 2017/0213891 A1 | 7/2017 | Li | |

FOREIGN PATENT DOCUMENTS

| | | |
|---|---|---|
| JP | 2005-19494 A | 1/2005 |
| JP | 2005-175357 A | 6/2005 |
| JP | 3711989 B2 | 8/2005 |
| JP | 2011-100967 A | 5/2011 |
| JP | 2017-55004 A | 3/2017 |
| JP | 2017-55005 A | 3/2017 |

\* cited by examiner

SEMICONDUCTOR DEVICE AND METHOD FOR MANUFACTURING THE SAME

CROSS-REFERENCE TO RELATED APPLICATIONS

This application is a divisional of U.S. application Ser. No. 15/252,493, filed Aug. 31, 2016 and is based upon and claims the benefit of priority from Japanese Patent Application No. 2015-179037, filed on Sep. 11, 2015, the entire contents of which are incorporated herein by reference.

FIELD

Embodiments described herein relate generally to a semiconductor device and a method for manufacturing the same.

BACKGROUND

Silicon carbide (SiC) is expected to be a material for next-generation semiconductor devices. In comparison to silicon (Si), SiC exhibits excellent physical properties, such as a band gap of three times larger than that of Si, a breakdown field strength of about ten times larger than that of Si, and a thermal conductivity of about three times larger than that of Si. By utilizing these properties, it is possible to realize a low-loss semiconductor device capable of operating at high temperatures.

It has been desired to realize a transistor having a high threshold voltage, in order to reduce a channel leak current at off state of a transistor in which SiC is used.

DETAILED DESCRIPTION

Semiconductor devices of embodiments each includes a p-type SiC region, a gate insulating film disposed on the p-type SiC region, and a gate electrode disposed on the gate insulating film and including a p-type impurity and 3C—SiC.

Embodiments of the present disclosure will be described below by referring to the accompanying drawings. In the following description, the same reference signs are given to the same or similar members, and the description thereof will not be repeated.

Notations, such as $n^+$, n, $n^-$, $p^+$, p, and $p^-$, indicate relative levels of impurity concentration for each conductivity type. That is, $n^+$ and $n^-$ respectively indicate a relatively higher impurity concentration and a relatively lower impurity concentration of an n-type impurity. Also, $p^+$ and $p^-$ respectively indicate a relatively higher impurity concentration and a relatively lower impurity concentration of a p-type impurity. Both $n^+$-type and $n^-$-type may simply be referred to as the n-type, and both $p^+$-type and $p^-$-type may simply be referred to as the p-type.

In the following disclosure, the concept of an "SiC substrate" covers an SiC layer formed on the substrate by epitaxial growth.

First Embodiment

A semiconductor device of the present embodiment includes a p-type SiC region, a gate insulating film disposed on the p-type SiC region, and a gate electrode disposed on the gate insulating film and including a p-type impurity and 3C—SiC.

Figure 1:
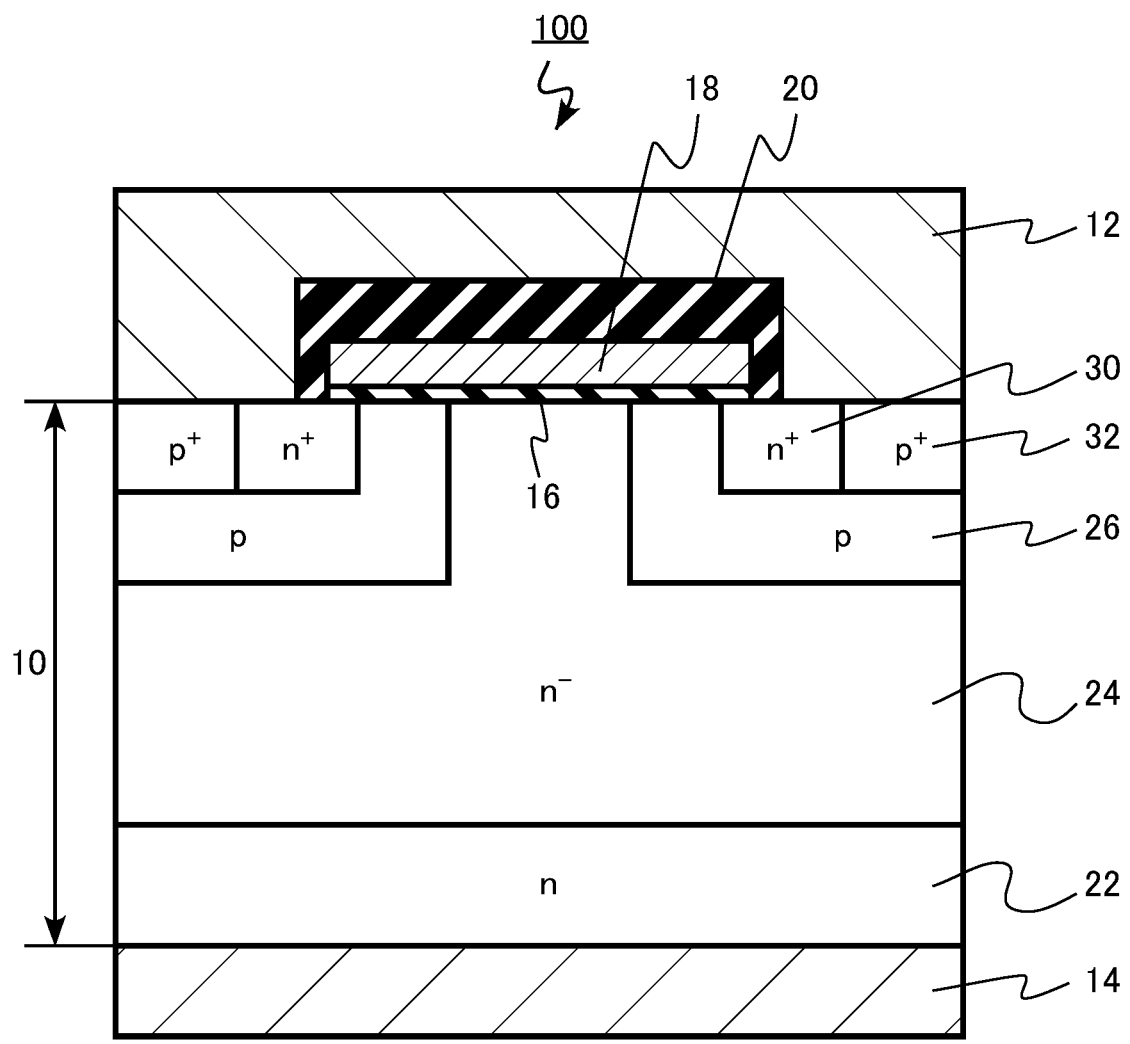
FIG. 1 is a schematic cross-sectional view of a semiconductor device of a first embodiment.

FIG. 1 is a schematic cross-sectional view illustrating the structure of a metal oxide semiconductor field effect transistor (MOSFET) implemented as the semiconductor device of the present embodiment. A MOSFET 100 is, for example, a double implantation MOSFET (DIMOSFET) in which a well region and a source region are formed by ion implantation. The MOSFET 100 is an n-type MOSFET that uses electrons as carriers.

The MOSFET 100 includes an SiC substrate 10, a source electrode 12, a drain electrode 14, a gate insulating film 16, a gate electrode 18, and an interlayer insulating film 20. The SiC substrate 10 includes a drain region 22, a drift region 24, a well region (p-type SiC region) 26, a source region 30, and a well contact region 32.

The SiC substrate 10 is made of, for example, 4H—SiC.

SiC may take a plurality of crystal forms. For example, SiC may be hexagonal 4H—SiC, hexagonal 6H—SiC, cubic 3C—SiC, or the like. The crystal form of SiC can be identified by observing the arrangement of atoms by a transmission electron microscope (TEM). The crystal form of SiC can also be identified according to X-ray diffraction (XRD).

The SiC substrate 10 includes a first face and a second face. In FIG. 1, the first face indicates the upper surface and the second face indicates the lower surface of the drawing. Hereinafter, the first face is referred to as the front face and the second face is referred to as the backside.

In the following description, an example in which the first face is inclined at an angle from 0 degree to 8 degrees relative to a (0001) plane and the second face is inclined at an angle from 0 degree to 8 degrees relative to a (000-1) plane is described. The (0001) plane is referred to as a silicon plane. The (000-1) plane is referred to as a carbon plane.

The drain region 22 is made of n-type SiC. The drain region 22 includes, for example, nitrogen (N) as an n-type impurity. A concentration of the n-type impurity in the drain region 22 is, for example, from $1 \times 10^{18}$ cm$^{-3}$ to $1 \times 10^{21}$ cm$^{-3}$.

From the viewpoint of reducing a contact resistance between the drain electrode 14 and the drain region 22, the concentration of the n-type impurity of the second face of the drain region 22 is preferably equal to or more than $1 \times 10^{19}$ cm$^{-3}$, and more preferably equal to or more than $1 \times 10^{20}$ cm$^{-3}$.

The drift region 24 is disposed on the drain region 22. The drift region 24 is made of, for example, n$^-$-type SiC on the drain region 22 by epitaxial growth. A thickness of the drift region 24 is, for example, from 5 μm to 150 μm.

The drift region 24 includes, for example, nitrogen (N) as the n-type impurity. A concentration of the n-type impurity in the drift region 24 is, for example, from $5 \times 10^{15}$ cm$^{-3}$ to $2 \times 10^{16}$ cm$^{-3}$.

The well region 26 is disposed on the drift region 24. The well region 26 is made of p-type SiC. The well region 26 is disposed between the source region 30 and the drift region 24. The well region 26 functions as a channel region of the MOSFET 100.

The well region 26 includes, for example, aluminum (Al) as the p-type impurity. A concentration of the p-type impurity in the well region 26 is, for example, from $5 \times 10^{15}$ cm$^{-3}$ to $1 \times 10^{18}$ cm$^{-3}$. From the viewpoint of having a proper on-current and threshold voltage of the MOSFET 100, the concentration of the p-type impurity is preferably equal to or less than $5 \times 10^{17}$ cm$^{-3}$, and more preferably equal to or less than $1 \times 10^{17}$ cm$^{-3}$. A depth of the well region 26 is, for example, from 0.4 μm to 0.8 μm.

The source region 30 is disposed in the well region 26. The source region 30 is made of n$^+$-type SiC. The source region 30 includes, for example, nitrogen (N) as the n-type impurity. A concentration of the n-type impurity in the source region 30 is, for example, from $1 \times 10^{18}$ cm$^{-3}$ to $1 \times 10^{21}$ cm$^{-3}$.

From the viewpoint of reducing a contact resistance between the source electrode 12 and the source region 30, the concentration of the n-type impurity in the first face of the source region 30 is preferably equal to or more than $1 \times 10^{19}$ cm$^{-3}$, and more preferably, equal to or more than $1 \times 10^{20}$ cm$^{-3}$.

A depth of the source region 30 is shallower than the depth of the well region 26, and is, for example, from 0.2 μm to 0.4 μm.

The well contact region 32 is disposed in the well region 26. The well contact region 32 is disposed on the side of the source region 30.

The well contact region 32 is made of p$^+$-type SiC. The well contact region 32 includes, for example, aluminum (Al) as the p-type impurity. A concentration of the p-type impurity in the well contact region 32 is, for example, from $1 \times 10^{18}$ cm$^{-3}$ to $1 \times 10^{21}$ cm$^{-3}$.

A depth of the well contact region 32 is shallower than the depth of the well region 26, and is, for example, from 0.2 μm to 0.4 μm.

The gate insulating film 16 is formed on the source region 30, the well region 26, and the drift region 24. The gate insulating film 16 is formed between the gate electrode 18 and a portion including the source region 30, the well region 26, and the drift region 24. The gate insulating film 16 may be formed by, for example, a silicon oxide film or a high-k insulating film.

The gate electrode 18 is disposed on the gate insulating film 16. The gate electrode 18 is made of 3C—SiC including the p-type impurity. The gate electrode 18 is made of polycrystalline 3C—SiC.

It is preferable that the substantially all SiC included in the gate electrode 18 is 3C—SiC. For example, if it is found by the XRD that a peak diffraction caused by a crystal plane of a crystal form other than 3C—SiC does not exceed the noise level, it is determined that no crystal form exists other than 3C—SiC.

It is preferable that the ratio of occupation volume of 3C—SiC among all SiC included in the gate electrode 18 is equal to or more than 90%. It is possible to determine whether the ratio of occupation volume of 3C—SiC is equal to or more than 90% by, for example, counting the occupation area of crystalline grains of 3C—SiC in the image obtained by a transmission electron microscope (TEM).

It is preferable that the ratio of occupation volume of 3C—SiC among all SiC included in the gate electrode 18 is larger than that of 4H—SiC. It is possible to determine whether the ratio of occupation volume of 3C—SiC is larger than the ratio of occupation volume of 4H—SiC by, for example, counting the occupation area of crystalline grains of 3C—SiC and 4H—SiC, respectively, in the image obtained by the TEM.

The p-type impurity included in the gate electrode 18 is aluminum (Al), gallium (Ga), or indium (In). From the viewpoint of metallizing 3C—SiC in the gate electrode 18, the concentration of the p-type impurity in the gate electrode 18 is preferably equal to or more than $1 \times 10^{19}$ cm$^{-3}$, and more preferably equal to or more than $1 \times 10^{20}$ cm$^{-3}$. It is further preferable that the concentration of the p-type impurity in the gate electrode 18 is equal to or more than $1 \times 10^{21}$ cm$^{-3}$.

The interlayer insulating film 20 is disposed on the gate electrode 18. The interlayer insulating film 20 is, for example, a silicon oxide film.

The well region 26 disposed between the source region 30 and the drift region 24 under the gate electrode 18 functions as the channel region of the MOSFET 100.

The source electrode 12 is disposed on the surface of the SiC substrate 10. The source electrode 12 is electrically connected to the source region 30 and the well contact region 32. The source electrode 12 is in contact with the well contact region 32 and the source region 30. The source electrode 12 also functions to provide a potential to the well region 26.

The source electrode 12 is made of metal. The metal that forms the source electrode 12 has, for example, a layered structure of titanium (Ti) and aluminum (Al). The metal that forms the source electrode 12 may react with the SiC substrate 10 to form metal silicide or metal carbide.

The drain electrode 14 is disposed on the backside of the SiC substrate 10. The drain electrode 14 is electrically connected to the drain region 22.

The drain electrode 14 is made of metal. The metal that forms the drain electrode 14 is, for example, nickel silicide (NiSi).

Next, a method for manufacturing the semiconductor device of the present embodiment is described. FIGS. 2 to 5 are schematic cross-sectional views illustrating the semiconductor device during the manufacturing process in a method for manufacturing the semiconductor device of the present embodiment.

The method for manufacturing the semiconductor device of the present embodiment includes forming a gate insulating film on a p-type SiC region, and forming, on the gate insulating film, a gate electrode including the p-type impurity and 3C—SiC under the condition of the highest temperature attainment of equal to or less than 1,200° C. The forming of the gate electrode includes depositing the 3C—SiC layer including the p-type impurity by chemical vapor deposition (CVD) at a temperature of equal to or less than 1,200° C.

First, the n-type SiC layer (drain region) 22 including the first face formed by a silicon face and the second face formed by a carbon face are prepared. The n-type SiC layer 22 is 4H—SiC.

Next, the n⁻-type drift region 24 is formed on the first face of the n-type SiC layer 22 by the epitaxial growth. The SiC substrate 10 is formed by the n-type SiC layer 22 and the n⁻-type drift region 24.

The p-type impurity of aluminum (Al) is selectively injected into the drift region 24 by photolithography and ion implantation. The well region 26 is formed by the ion implantation.

The p-type impurity of aluminum (Al) is selectively injected into the drift region 24 by photolithography and ion implantation. The well contact region 32 is formed by the ion implantation.

Figure 2:
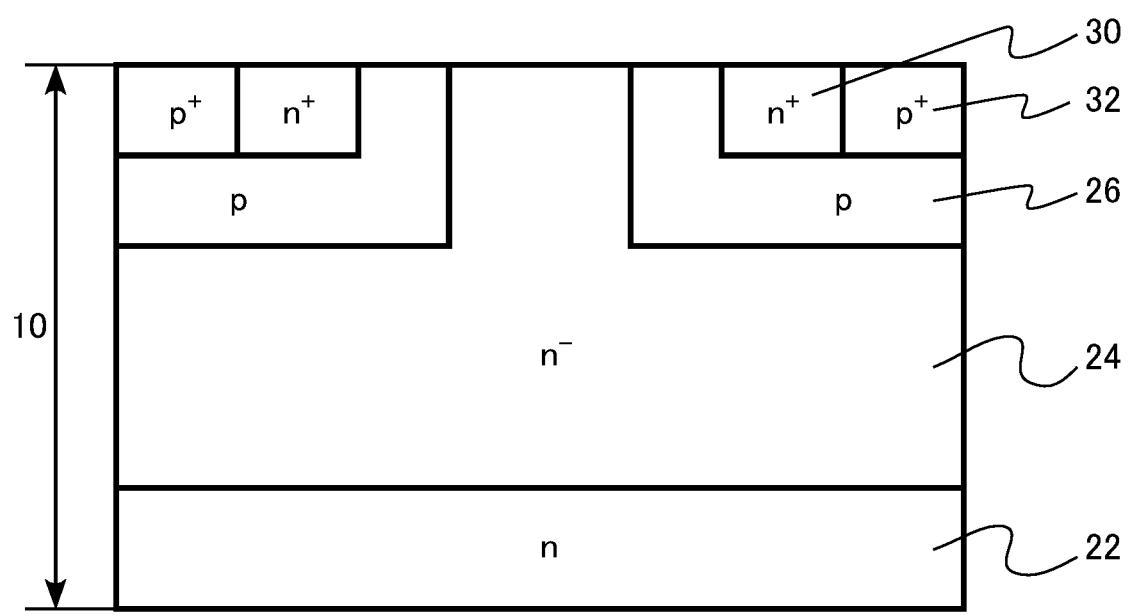
FIG. 2 is a schematic cross-sectional view of a semiconductor device during a manufacturing process of the first embodiment.

The n-type impurity of nitrogen (N) is selectively injected into the drift region 24 by photolithography and ion implantation. The source region 30 is formed by the ion implantation (FIG. 2).

Subsequently, annealing is performed to activate the p-type impurity and the n-type impurity. Activation annealing is performed at a temperature from 1,700° C. to 1,900° C. in the inert gas atmosphere.

The gate insulating film 16 is formed on the surface of the SiC substrate 10. The gate insulating film 16 is a silicon oxide film formed by, for example, CVD.

Figure 3:
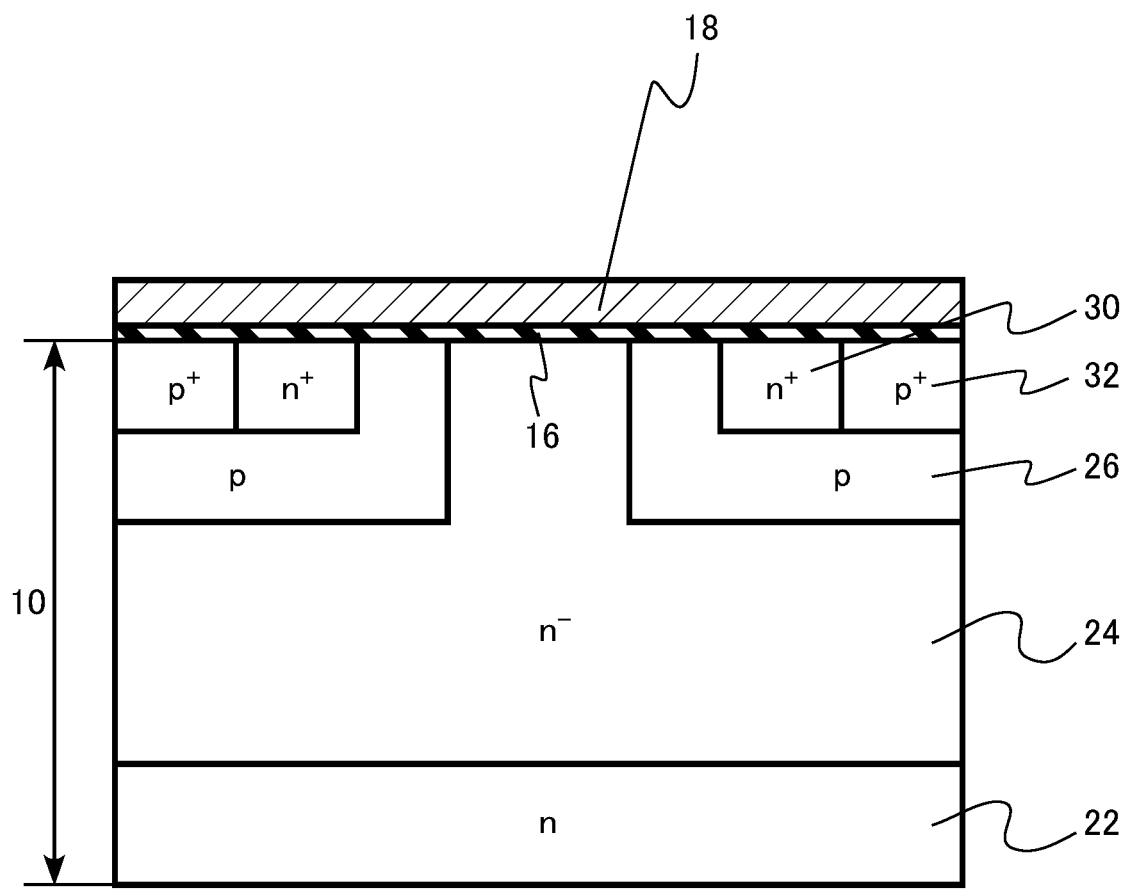
FIG. 3 is a schematic cross-sectional view of the semiconductor device during the manufacturing process of the first embodiment.

Subsequently, the 3C—SiC layer 18 including the p-type impurity is deposited by CVD on the gate insulating film 16 (FIG. 3). The 3C—SiC layer 18 is deposited at a temperature of, for example, from 1,000° C. to 1,200° C. As the 3C—SiC layer 18 is deposited at a temperature of equal to or less than 1,200° C., the appearance of SiC having a crystal form other than 3C—SiC that is more stable at a high temperature than 3C—SiC is restricted. The 3C structure is the most stable polytype for forming films at a low temperature. Without considering the effect of undercoating, most polycrystals are expected to have the 3C structure. That is, it is possible to form a polycrystal film having a uniform crystal structure. At high temperatures, however, 3C, 6H, 4H, or other structures are formed, and it is difficult to form the polycrystal film having a uniform crystal structure.

The p-type impurity is aluminum (Al), gallium (Ga), or indium (In). For example, trimethylaluminum may be used as a raw material gas during the CVD when the p-type impurity is aluminum (Al).

Figure 4:
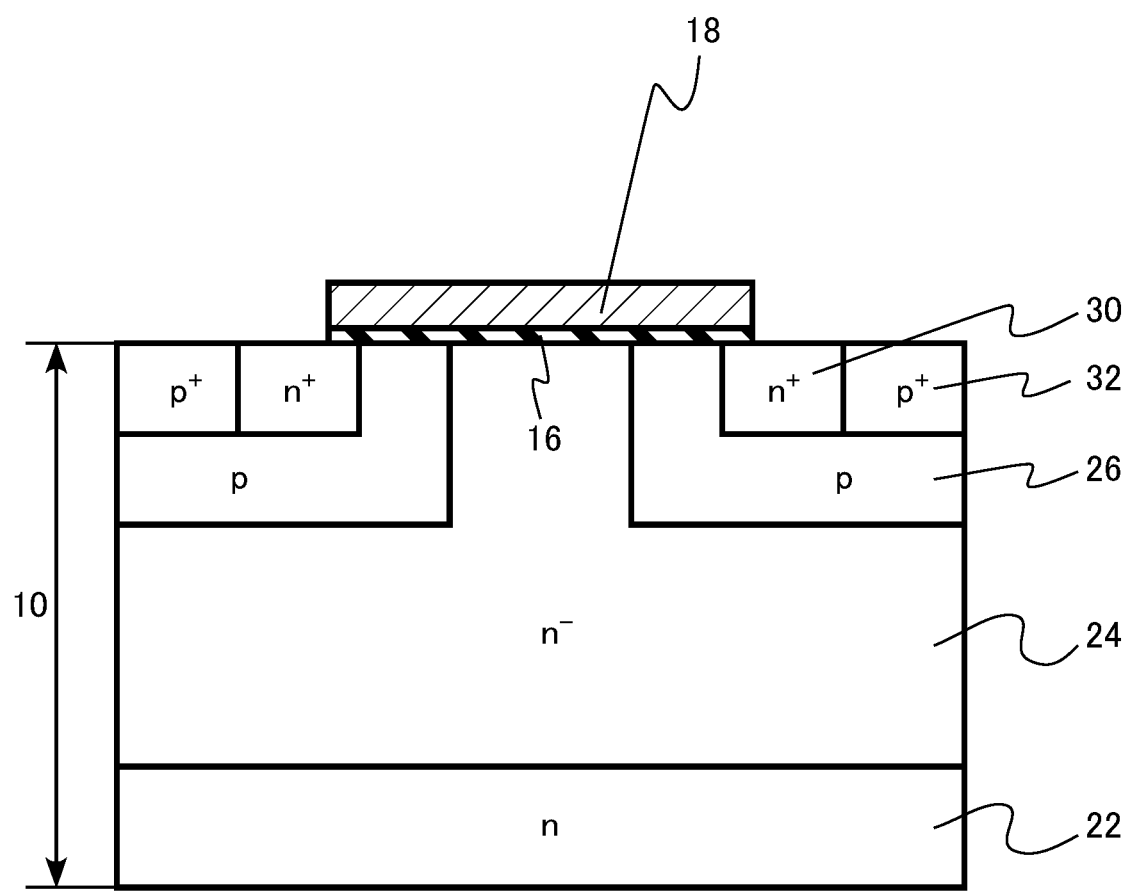
FIG. 4 is a schematic cross-sectional view of the semiconductor device during the manufacturing process of the first embodiment.

The gate electrode 18 and the gate insulating film 16 are patterned (FIG. 4). Patterning of the gate electrode 18 and the gate insulating film 16 are patterned by photolithography and dry etching.

Figure 5:
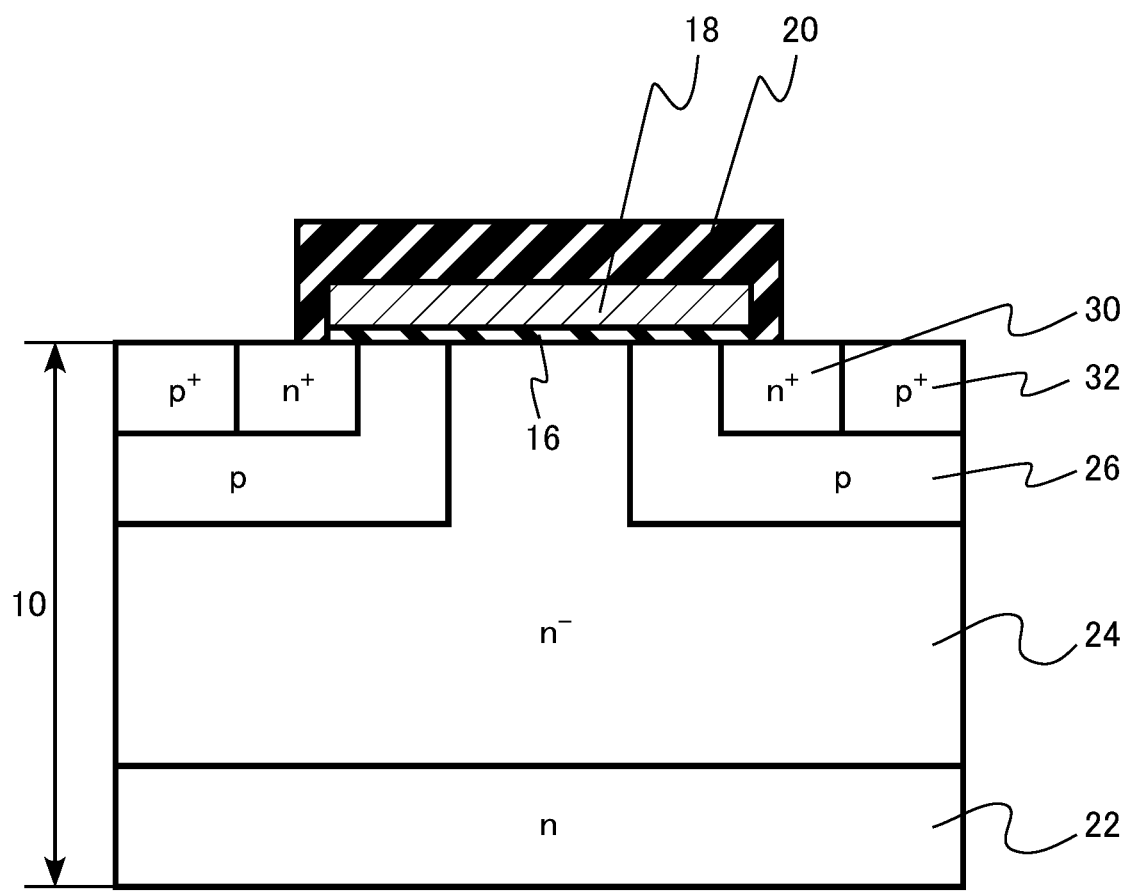
FIG. 5 is a schematic cross-sectional view of the semiconductor device during the manufacturing process of the first embodiment.

The interlayer insulating film 20 is formed on the SiC substrate 10 and the gate electrode 18 (FIG. 5). The interlayer insulating film 20 is formed, for example, by patterning the silicon oxide film after the silicon oxide film is deposited by the CVD.

The source electrode 12 is formed on the source region 30 and the well contact region 32. The source electrode 12 is formed, for example, by sputtering titanium (Ti) and aluminum (Al).

The drain electrode 14 is formed on the backside of the SiC substrate 10. The drain electrode 14 is, for example, nickel silicide (NiSi) formed by sputtering and heat treatment of nickel (Ni).

The MOSFET 100 illustrated in FIG. 1 is thus formed according to the manufacturing method described above.

The function and the effect of the semiconductor device of the present embodiment will be described below.

It is necessary to suppress a leak current in the off state of the MOSFET from the viewpoint of realizing a low power consumption device. To suppress the leak current during the off state of the MOSFET, a threshold voltage of the MOSFET should be increased.

If the energy level of the upper end of the valence band of the semiconductor in the p-type channel region made closer to the work function of the gate electrode, the threshold voltage of the n-type MOSFET can be increased. During the off state of the MOSFET, the energy band of the semiconductor is curved such that the Fermi level of the p-type channel region coincides with the work function of the gate electrode. The Fermi level of the p-type channel region is near the upper end of the valence band of the semiconductor of the p-type channel region. Thus, the curving of the energy band of the semiconductor is loosened during the off state of the MOSFET by bringing the energy level of the semiconductor at the upper end of the valence band in the p-type channel region to approach the work function of the gate electrode. As a result of this, the threshold voltage of the MOSFET is increased.

The threshold voltage of the MOSFET also increases as the band gap energy of the semiconductor of the p-type channel region increases. This is because the energy band needs to be largely curved to form an inversion layer when the difference between the energy level at the lower end of the conduction band of the p-type channel region and the Fermi level of the p-type channel region becomes large.

Figure 6:
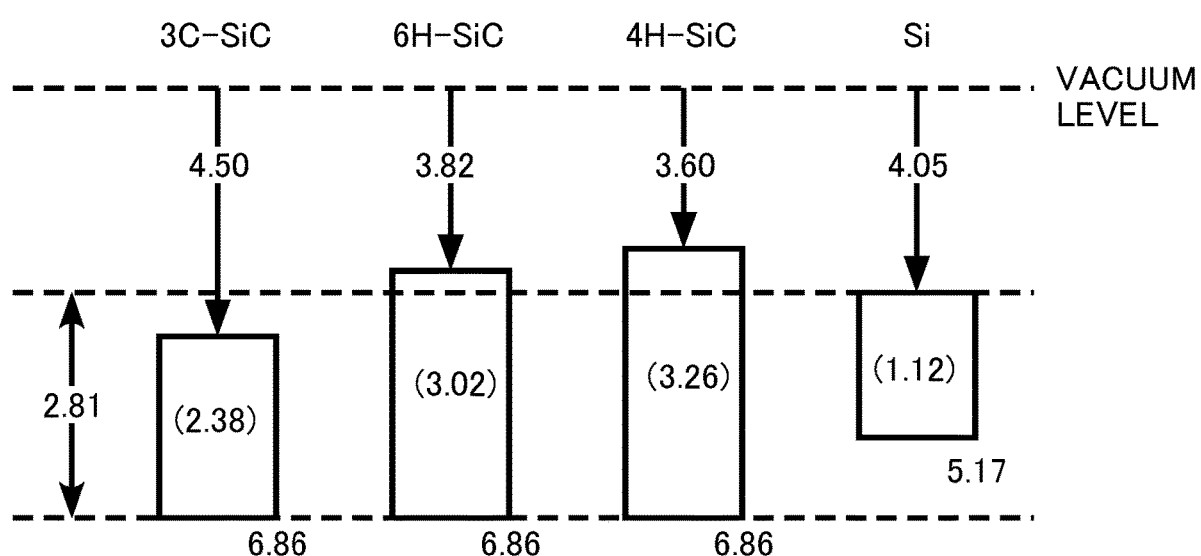
FIG. 6 is an explanatory diagram illustrating the function and the effect of the semiconductor device of the first embodiment.

FIG. 6 is an explanatory diagram illustrating the function and the effect of the semiconductor device of the present embodiment. FIG. 6 illustrates a calculation result of the energy band structure of the semiconductor according to a first principle calculation.

FIG. 6 illustrates the energy band structure of silicon (Si), 4H—SiC, 6H—SiC, and 3C—SiC. For each material, a difference in energy between the vacuum level and the lower end of the conduction band (electron affinity), a difference in energy between the vacuum level and the upper end of the valence band, and a band gap energy are illustrated. In the drawing, the numbers put in the brackets represent the band gap energy.

The work function represents a difference in energy between the vacuum level (energy level of the vacuum) and the Fermi level of a substance of interest. The electron affinity represents a difference in energy between the vacuum level (energy level of the vacuum) and the energy level at the lower end of the conduction band of a substance of interest.

When the n-type impurity is introduced to metallize the semiconductor, the Fermi level of the semiconductor is regarded to be equal to the energy level at the lower end of the conduction band. Thus, the work function of the semiconductor is regarded to be equal to the electron affinity. When the p-type impurity is introduced to metallize the semiconductor, the Fermi level of the semiconductor is regarded to be equal to the energy level at the upper end of the valence band. Thus, the work function of the semiconductor is regarded to be equal to the difference in energy between the vacuum level and the upper end of the valence band.

For example, in the case in which the p-type channel region is made of 4H—SiC, the threshold voltage of the MOSFET becomes higher when the p-type silicon is used for the gate electrode than using the n-type silicon. This is because, as illustrated in FIG. 6, the work function (difference in energy between the vacuum level and the upper end of the valence band) of the p-type silicon is closer to the energy level of the 4H—SiC semiconductor at the upper end of the valence band than the work function (difference in energy between the vacuum level and the lower end of the conduction band (electron affinity)) of the n-type silicon. The threshold voltage can be increased by 1.12 V, which corresponds to the band gap energy of silicon, compared to the case in which the n-type silicon is used as the gate electrode.

The threshold voltage can further be increased by forming the gate electrode with the p-type 4H—SiC, when the p-type channel region is made of 4H—SiC. This is because the work function of the p-type 4H—SiC is equal to the energy level at the upper end of the valence band of the 4H—SiC semiconductor. The threshold voltage can be increased by 2.81 V compared to the case in which the n-type silicon is used as the gate electrode.

In the present embodiment, the p-type 3C—SiC including the p-type impurity is used as the gate electrode 18. It is apparent, as illustrated in FIG. 6, 3C—SiC and 4H—SiC have the same energy level at the upper end of the valence band according to the first principle calculation. The threshold voltage, therefore, can be made higher by 2.81 V even when the p-type 3C—SiC is used as the gate electrode, compared to the case, for example, in which the n-type silicon is used as the gate electrode.

When the gate electrode of SiC is made to include the p-type impurity, a problem of diffusion of the p-type impurity due to heat treatment for forming the gate electrode may occur. For example, when 4H—SiC is activated by introducing the p-type impurity, the heat treatment of equal to or more than 1,600° C. is needed.

The p-type impurity is diffused due to the high temperature of the heat treatment over the gate insulating film or the SiC substrate. The diffused p-type impurity may form, for example, a trap level to cause the change of characteristics of the MOSFET. The change of characteristics of the MOSFET is, for example, the change of the threshold voltage. This leads to the decrease of reliability of the MOSFET. In particular, when the p-type impurity is boron (B) whose atomic radius is small and having a high diffusion speed, the change of characteristics of the MOSFET causes a serious problem. In addition, the heat treatment of the insulating film, such as the silicon oxide film, is very difficult over 1,400° C. For example, at the activating temperature of 1,600° C. described above, the insulating film may be deteriorated.

3C—SiC is the crystal that is stable at low temperatures compared to the crystal forms, such as 4H—SiC, 6H—SiC, or the like. 3C—SiC can be crystallized at a low temperature of the highest attainment temperature of equal to or less than 1,200° C., and the p-type impurity is activated.

In the present embodiment, 3C—SiC that can be formed at a low temperature is used for the gate electrode 18. This leads to suppression of diffusion of the p-type impurity during the formation of the gate electrode. Thus, the MOSFET 100 with the improved reliability is realized.

Since aluminum (Al), gallium (Ga), or indium (In), each of which has an atomic radius larger than that of boron (B), is used as the p-type impurity to be introduced into the gate electrode 18, the diffusion of the p-type impurity is further suppressed. Thus, the MOSFET 100 with the improved reliability is realized.

It is preferable that the ratio of occupation volume of 3C—SiC among all SiC included in the gate electrode 18 is equal to or more than 90%. It is also preferable that substantially all SiC included in the gate electrode 18 is 3C—SiC. If other crystal form, such as 4H—SiC, is mixed, the resistance of the gate electrode 18 may increase. The increase of the resistance may be caused by the fact that the border of different crystal forms comes to have a high resistance.

Thus, the MOSFET 100 having a high threshold voltage is realized according to the present embodiment. In addition, the MOSFET 100 whose characteristics do not change largely and having the improved reliability is realized.

Second Embodiment

A semiconductor device of the present embodiment is similar to that of the first embodiment, except that the gate electrode has a layered structure of 3C—SiC and a metal. A method for manufacturing the semiconductor device of the present embodiment is also similar to that of the first embodiment, except for the forming of the gate electrode. In the following, what are similar to those of the first embodiment will not be repeated.

Figure 7:
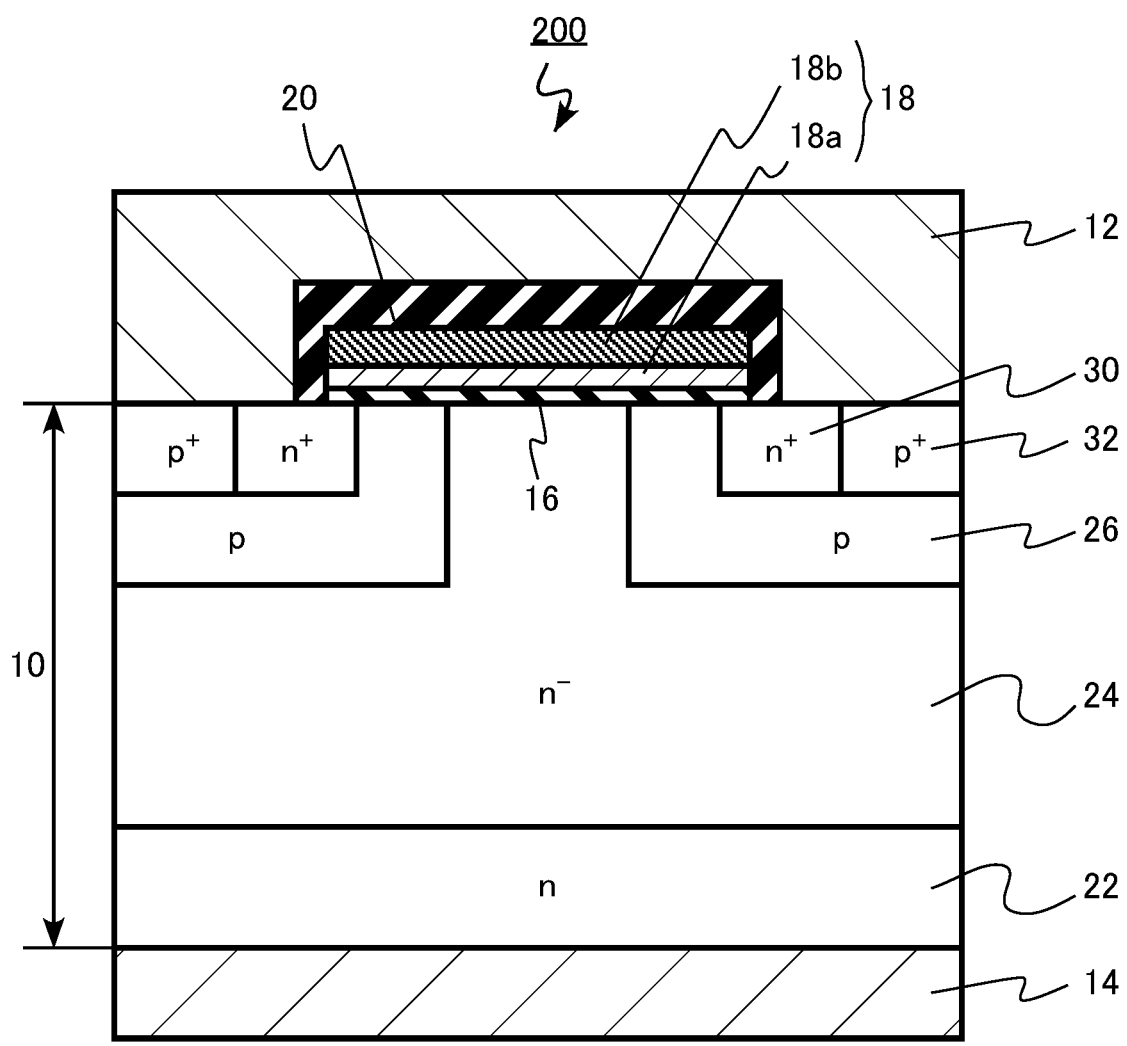
FIG. 7 is a schematic cross-sectional view of a semiconductor device of a second embodiment.

FIG. 7 is a schematic cross-sectional view illustrating the structure of a MOSFET implemented as the semiconductor device of the present embodiment. A MOSFET 200 is a DIMOSFET in which well and source regions are formed by ion implantation. The MOSFET 200 is an n-type MOSFET that uses electrons as carriers.

The MOSFET 200 includes the SiC substrate 10, the source electrode 12, the drain electrode 14, the gate insulating film 16, the gate electrode 18, and the interlayer insulating film 20. The SiC substrate 10 includes the drain region 22, the drift region 24, the well region (p-type SiC region) 26, the source region 30, and the well contact region 32.

The gate electrode 18 has a layered structure of a 3C—SiC layer 18a, which includes the p-type impurity, and a metal layer 18b. The metal layer 18b is, for example, titanium nitride (TiN).

Next, a method for manufacturing the semiconductor device of the present embodiment is described. FIGS. 8 to 13 are schematic cross-sectional views illustrating the semiconductor device during the manufacturing process in a method for manufacturing the semiconductor device of the present embodiment.

The method for manufacturing the semiconductor device of the present embodiment includes forming a gate insulating film on a p-type SiC region, and forming, on the gate insulating film, a gate electrode including the p-type impurity and 3C—SiC under the condition of the highest attainment temperature of equal to or less than 1,200° C. The forming of the gate electrode includes depositing the silicon film including the p-type impurity and performing heat treatment to carbonize the silicon film at a temperature of equal to or less than 1,200° C.

First, the n-type SiC layer (drain region) 22 including the first face formed by a silicon face and the second face formed by a carbon face are prepared. The n-type SiC layer 22 is 4H—SiC.

The n⁻-type drift region 24 is formed on the first face of the n-type SiC layer (drain region) 22 by epitaxial growth. The SiC substrate 10 is formed by the n-type SiC layer 22 and the n⁻-type drift region 24.

The p-type impurity of aluminum (Al) is selectively injected into the drift region 24 by photolithography and ion implantation. The well region 26 is formed by the ion implantation.

The p-type impurity of aluminum (Al) is selectively injected into the drift region 24 by photolithography and ion implantation. The well contact region 32 is formed by the ion implantation.

Figure 8:
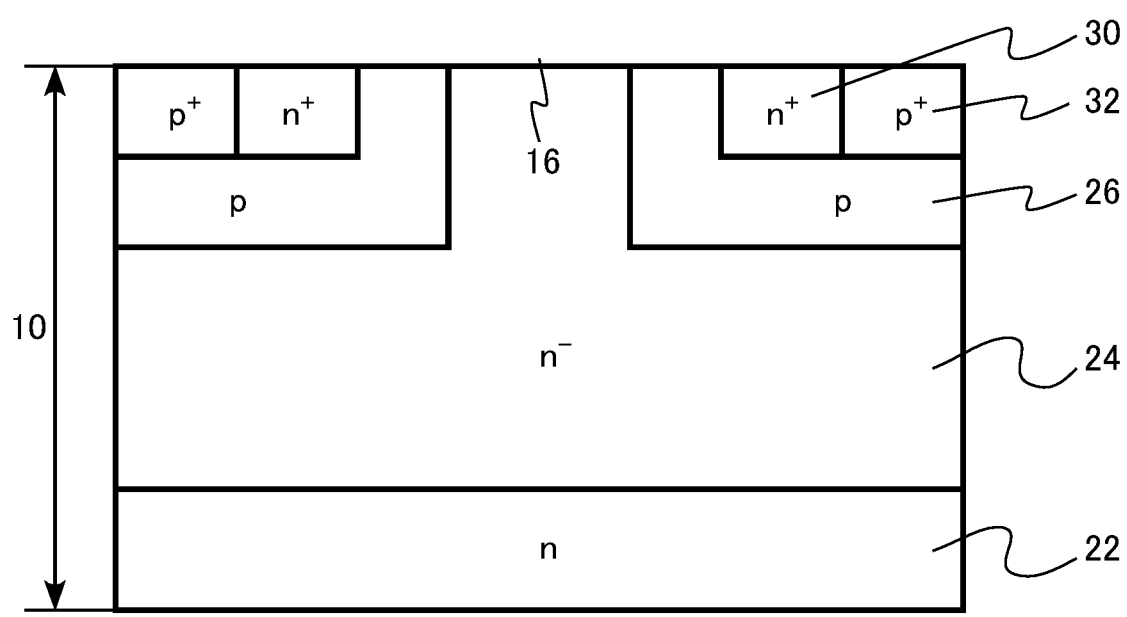
FIG. 8 is a schematic cross-sectional view of a semiconductor device during a manufacturing process of the second embodiment.

The n-type impurity of nitrogen (N) is selectively injected into the drift region 24 by photolithography and ion implantation. The source region 30 is formed by the ion implantation (FIG. 8).

Subsequently, annealing is performed to activate the p-type impurity and the n-type impurity. Activation annealing is performed at a temperature from 1,700° C. to 1,900° C. in the inert gas atmosphere.

The gate insulating film 16 is formed on the face of the SiC substrate 10. The gate insulating film 16 is a silicon oxide film formed, for example, by the CVD.

Figure 9:
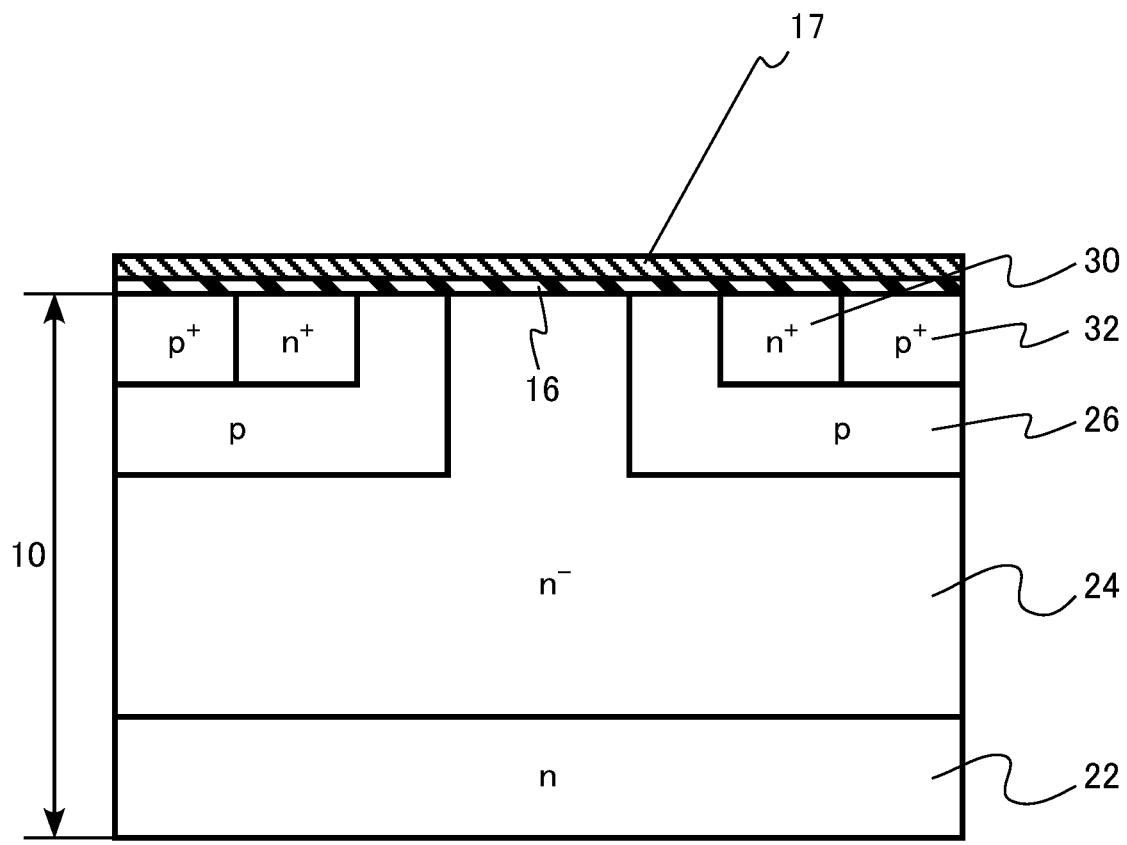
FIG. 9 is a schematic cross-sectional view of the semiconductor device during the manufacturing process of the second embodiment.

The silicon (Si) film 17 including the p-type impurity is deposited on the gate insulating film 16 by the CVD (FIG. 9). The silicon film 17 is deposited at a temperature of, for example, from 800° C. to 1,000° C.

The silicon film 17 is a polycrystalline or amorphous film. The p-type impurity is aluminum (Al), gallium (Ga), or indium (In).

Figure 10:
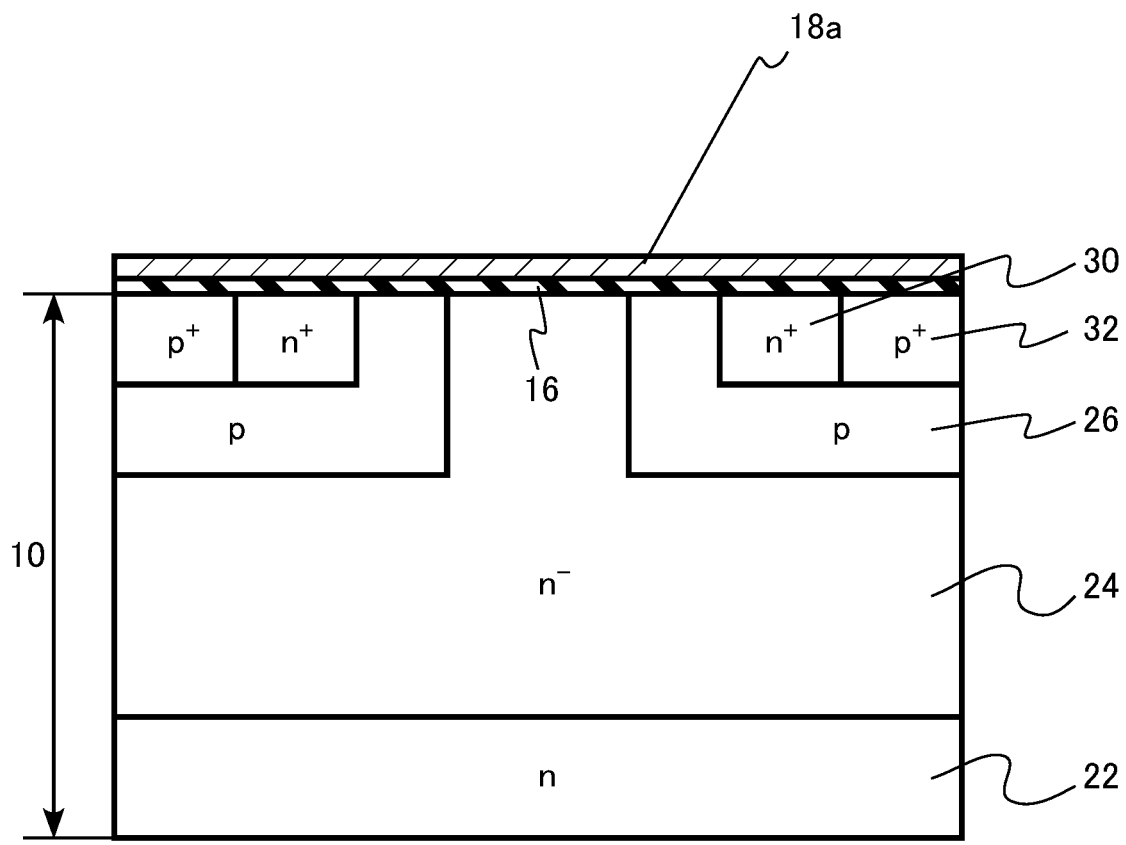
FIG. 10 is a schematic cross-sectional view of the semiconductor device during the manufacturing process of the second embodiment.

Subsequently, the silicon film 17 is carbonized to form the 3C—SiC layer 18a including the p-type impurity (FIG. 10). The carbonization of the silicon film 17 is performed in an atmosphere including, for example, ethane ($C_2H_6$), ethylene ($C_2H_6$), or acetylene ($C_2H_2$) by heat treatment at a temperature from 1,000° C. to 1,200° C. For example, the heat treatment may be performed in the atmosphere of plasma including ethane ($C_2H_6$), ethylene ($C_2H_6$), or acetylene ($C_2H_2$). As a result of this, poly-SiC having the most stable 3C structure in the temperature range described above among the polytypes of the SiC structure range is obtained.

Figure 11:
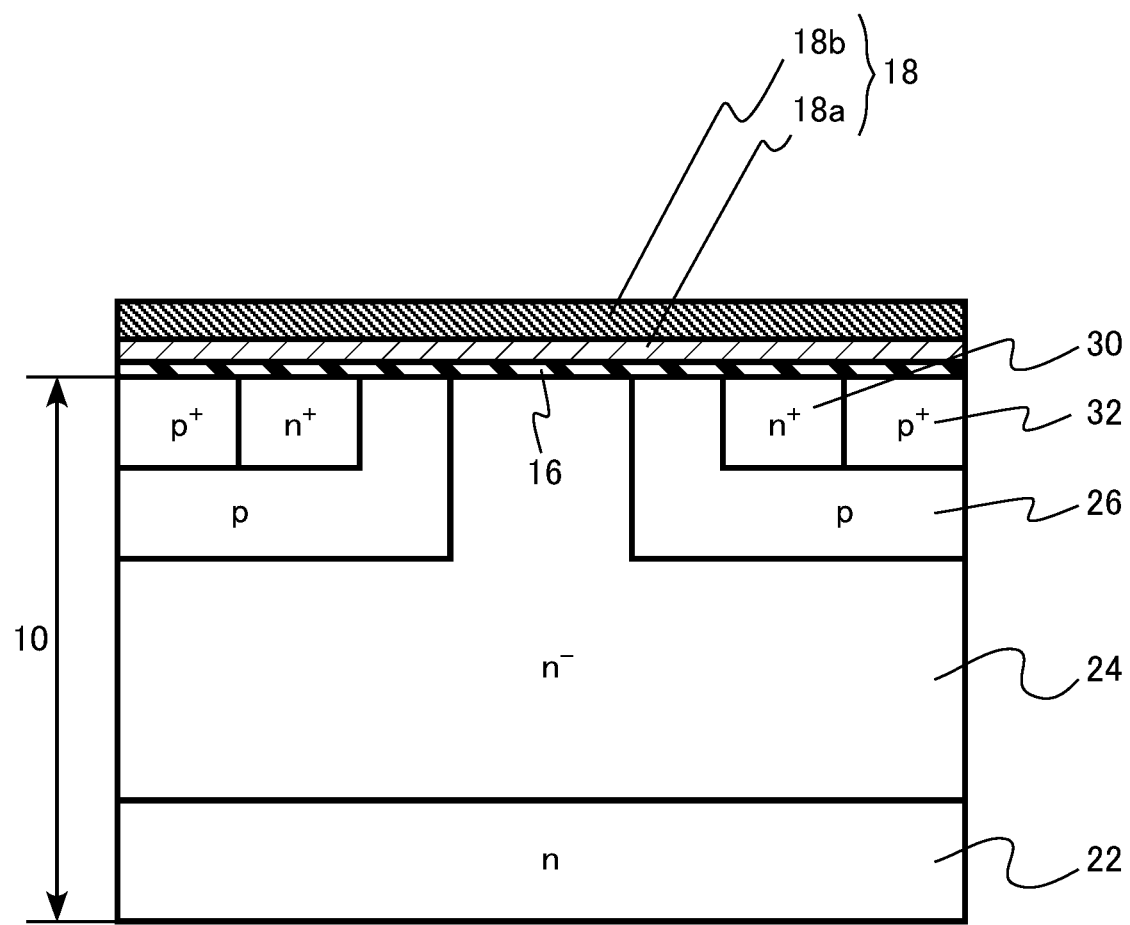
FIG. 11 is a schematic cross-sectional view of the semiconductor device during the manufacturing process of the second embodiment.

Subsequently, the metal layer 18b is formed on the 3C—SiC layer 18a (FIG. 11). The metal layer 18b is formed by, for example, sputtering. The metal layer 18b is, for example, titanium nitride (TiN).

Figure 12:
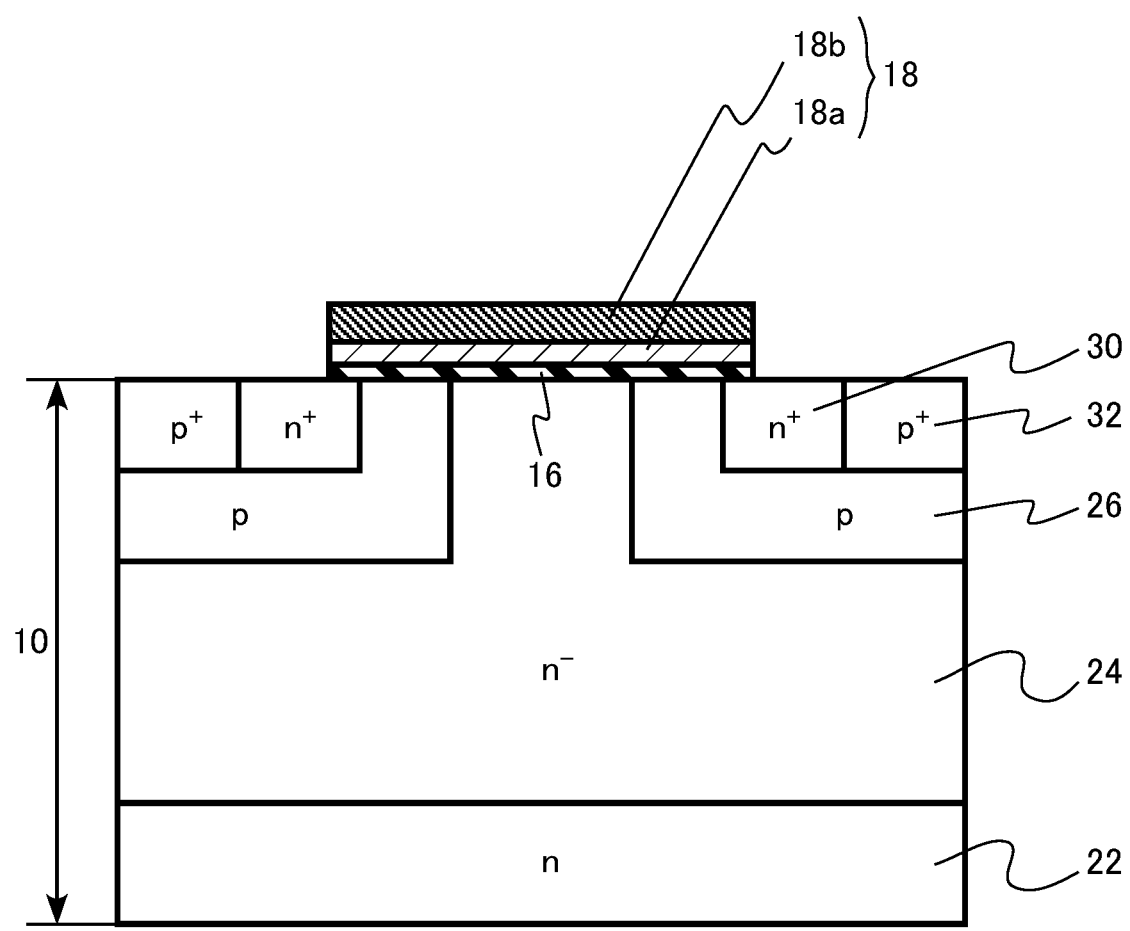
FIG. 12 is a schematic cross-sectional view of the semiconductor device during the manufacturing process of the second embodiment.

The gate electrode 18 and the gate insulating film 16 are patterned (FIG. 12). Patterning of the gate electrode 18 and the gate insulating film 16 are patterned by photolithography and dry etching.

Figure 13:
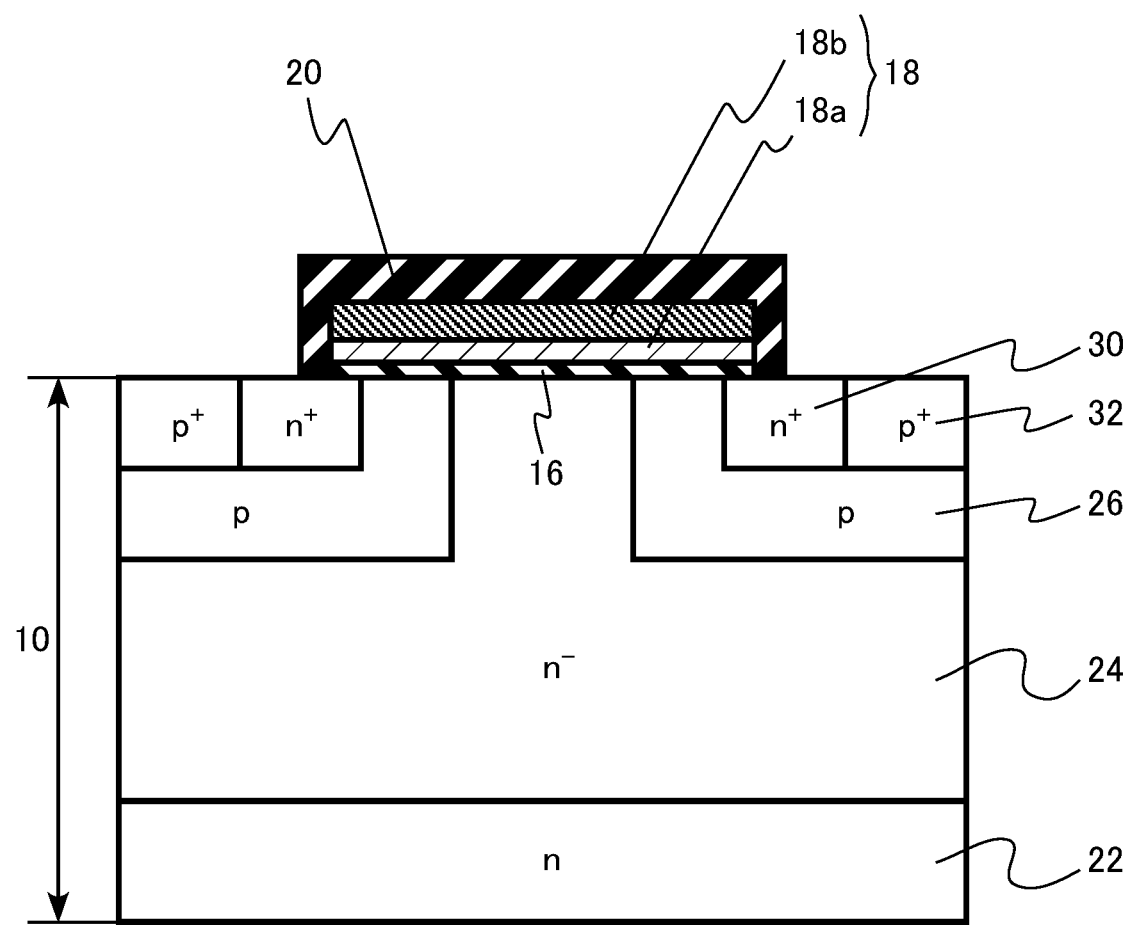
FIG. 13 is a schematic cross-sectional view of the semiconductor device during the manufacturing process of the second embodiment.

The interlayer insulating film 20 is formed on the SiC substrate 10 and the gate electrode 18 (FIG. 13). The interlayer insulating film 20 is formed, for example, by patterning the silicon oxide film after the silicon oxide film is deposited by the CVD.

The source electrode 12 is formed on the source region 30 and the well contact region 32. The source electrode 12 is formed by, for example, sputtering titanium (Ti) and aluminum (Al).

The drain electrode 14 is formed on the backside of the SiC substrate 10. The drain electrode 14 is, for example, nickel silicide (NiSi) formed by sputtering and heat treatment of nickel (Ni).

The MOSFET 200 is thus formed as illustrated in FIG. 7 by the manufacturing method described above.

According to the present embodiment, the MOSFET 200 having a high threshold value is realized as in the first embodiment. Further, the MOSFET 200 whose characteristics do not change largely and having the improved reliability is realized as in the first embodiment. Further, the gate electrode 18 with the metal layer 18b decreases the resistance. The MOSFET 200 in which a gate delay is suppressed and capable of high speed operation is realized.

Third Embodiment

A semiconductor device of the present embodiment differs from that of the first embodiment in that the MOSFET has a trench gate structure. In the following, what are similar to those of the first embodiment will not be repeated.

Figure 14:
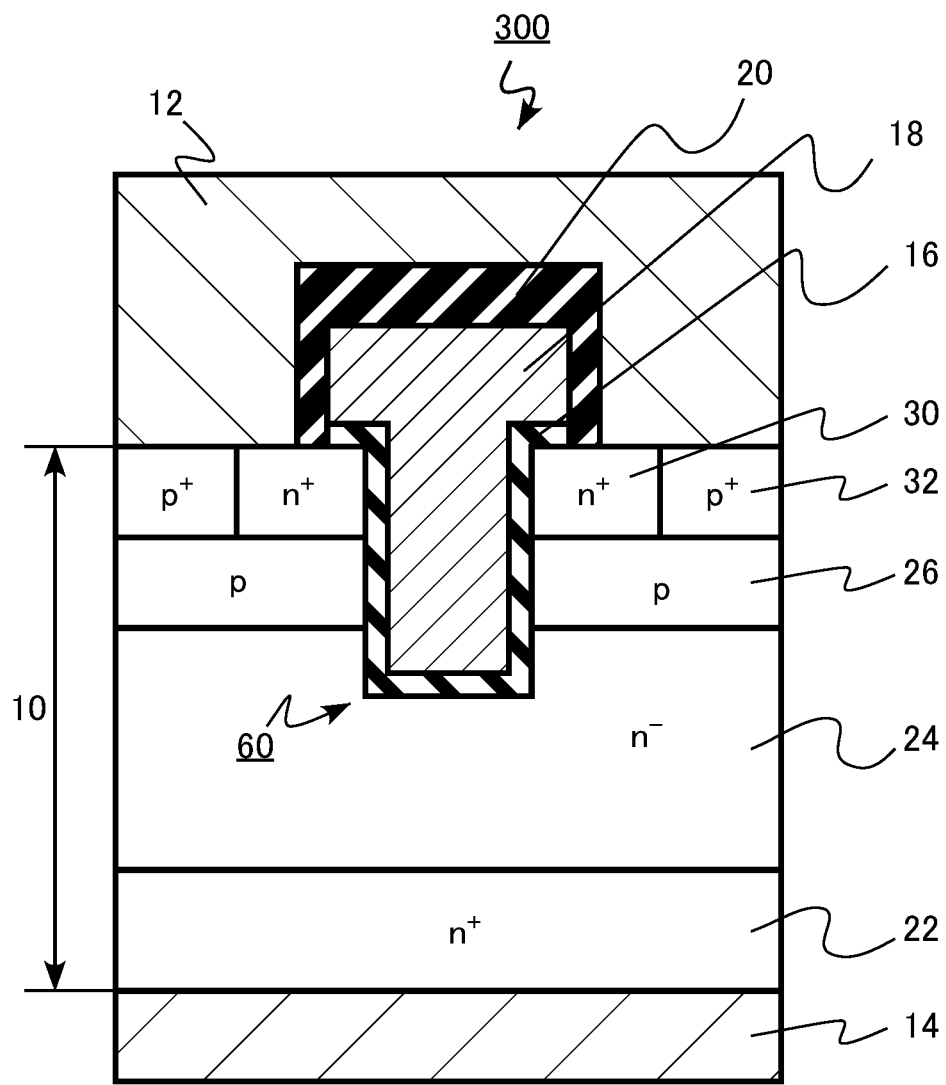
FIG. 14 is a schematic cross-sectional view of a semiconductor device of a third embodiment.

FIG. 14 is a schematic cross-sectional view illustrating the structure of a MOSFET implemented as the semiconductor device of the present embodiment. A MOSFET 300 has a trench gate structure in which a gate electrode is disposed in a trench.

The MOSFET 300 includes the SiC substrate 10, the source electrode 12, the drain electrode 14, the gate insulating film 16, the gate electrode 18, and the interlayer insulating film 20. The SiC substrate 10 includes a drain region 22, a drift region 24, a well region (p-type SiC region) 26, a source region 30, and a well contact region 32.

The gate insulating film 16 and the gate electrode 18 are formed in a trench 60 formed in the SiC substrate 10. The gate electrode 18 may have a layered structure, as in the second embodiment, of, for example, an Al-doped polycrystal 3C—SiC, and a metal, such as TiN.

According to the present embodiment, the MOSFET 300 having a high threshold voltage is realized as in the first embodiment. The MOSFET 300 whose characteristics do not change largely and having the improved reliability is realized as in the first embodiment. Further, the MOSFET 300 having a large on-current is realized by providing the trench gate structure.

Fourth Embodiment

A semiconductor device according to the present embodiment differs from that of the first embodiment in that the semiconductor device is an insulated gate bipolar transistor (IGBT). In the following, what are similar to those of the first embodiment will not be repeated.

Figure 15:
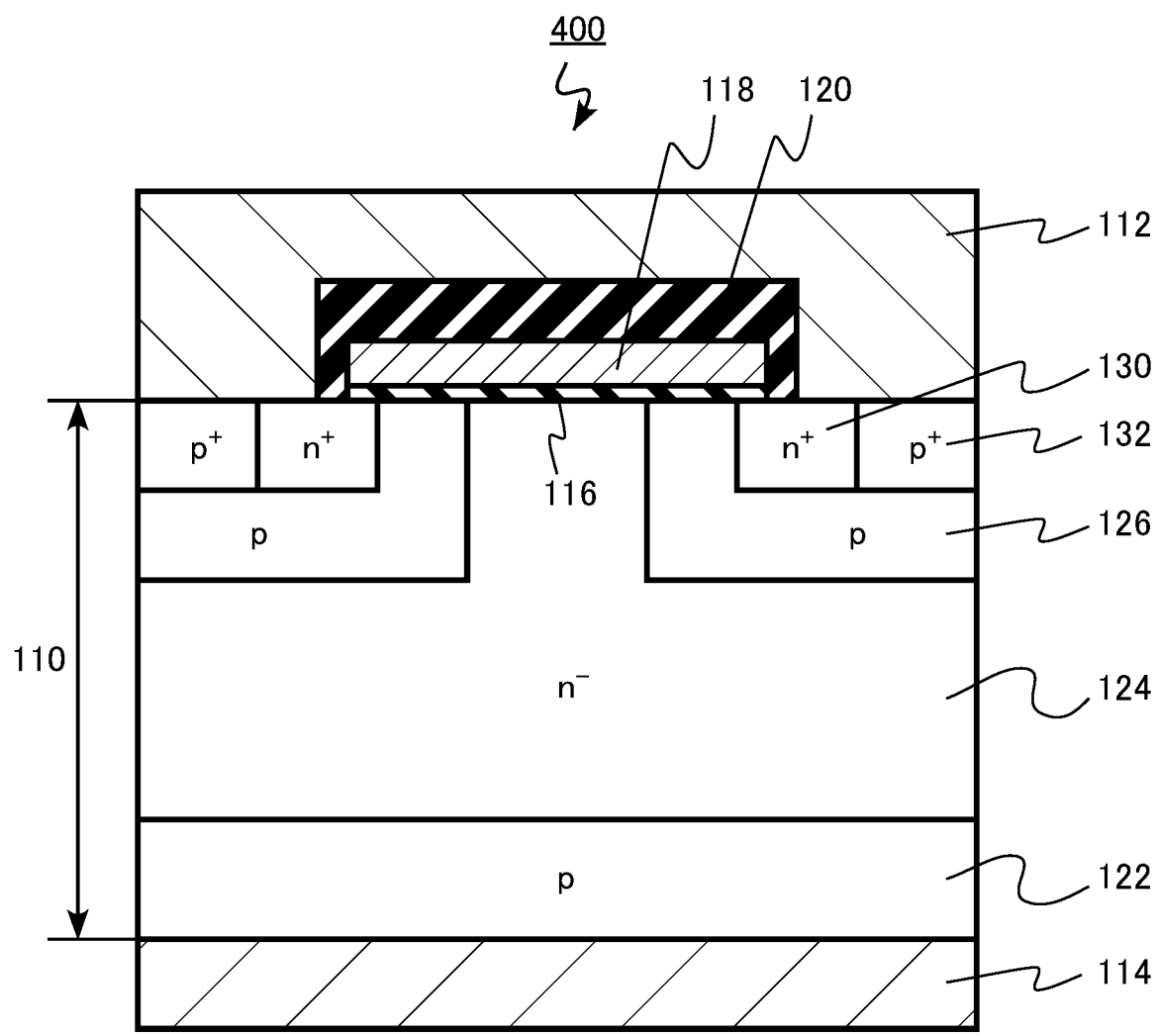
FIG. 15 is a schematic cross-sectional view of a semiconductor device of a fourth embodiment.

FIG. 15 is a schematic cross-sectional view illustrating the structure of an IGBT implemented as the semiconductor device of the present embodiment.

An IGBT 400 includes an SiC substrate 110, an emitter electrode 112, a collector electrode 114, a gate insulating film 116, a gate electrode 118, and an interlayer insulating film 120. The SiC substrate 110 includes a collector region 122, a drift region 124, a base region (p-type SiC region) 126, an emitter region 130, and a base contact region 132.

The SiC substrate 110 is, for example, 4H—SiC.

The SiC substrate 110 includes a first face and a second face. In FIG. 15, the first face represents the upper surface and the second face represents the lower surface of the drawing. Hereinafter, the first face is referred to as the front face and the second face is referred to as the backside.

In the following example described below, the first face is inclined at an angle from 0 degree to 8 degrees relative to a (0001) plane, and the second face is inclined at an angle from 0 degree to 8 degrees relative to a (000-1) plane. The (0001) plane is referred to as a silicon plane. The (000-1) plane is referred to as a carbon plane.

The collector region 122 is made of p-type SiC. The collector region 122 includes, for example, aluminum (Al) as the p-type impurity. A concentration of the p-type impurity of the collector region 122 is, for example, from $1\times10^{18}$ $cm^{-3}$ to $1\times10^{21}$ $cm^{-3}$.

From the viewpoint of reducing a contact resistance between the collector electrode 114 and the collector region 122, the concentration of the p-type impurity of the second face of the collector region 122 is preferably equal to or more than $1\times10^{19}$ $cm^{-3}$, and more preferably, equal to or more than $1\times10^{20}$ $cm^{-3}$.

The drift region 124 is disposed on the collector region 122. The drift region 124 is, for example, $n^-$-type SiC formed on the collector region 122 by epitaxial growth. A thickness of the drift region 124 is, for example, from 5 μm to 150 μm.

The drift region 124 includes, for example, nitrogen (N) as the n-type impurity. A concentration of the n-type impurity of the drift region 124 is, for example, from $5\times10^{15}$ $cm^{-3}$ to $2\times10^{16}$ $cm^{-3}$.

The base region 126 is disposed on the drift region 124. The base region 126 is p-type SiC. The base region 126 functions as a channel region of the IGBT 400.

The base region 126 includes, for example, aluminum (Al) as the p-type impurity. A concentration of the p-type impurity of the base region 126 is, for example, from $5\times10^{15}$ $cm^{-3}$ to $1\times10^{19}$ $cm^{-3}$. A depth of the base region 126 is, for example, from 0.4 μm to 0.8 μm.

The emitter region 130 is disposed in the base region 126. The emitter region 130 is made of $n^+$-type SiC. The emitter region 130 includes nitrogen (N) as the n-type impurity. The concentration of the n-type impurity in the emitter region 130 is, for example, from $1\times10^{18}$ $cm^{-3}$ to $1\times10^{21}$ $cm^{-3}$.

From the viewpoint of reducing a contact resistance between the emitter electrode 112 and the emitter region 130, the concentration of the n-type impurity of the first face of the emitter region 130 is preferably equal to or more than $1\times10^{19}$ $cm^{-3}$ and, more preferably, equal to or more than $1\times10^{20}$ $cm^{-3}$.

A depth of the emitter region 130 is shallower than the depth of the base region 126, and is, for example, from 0.2 μm to 0.4 μm.

The base contact region 132 is disposed in the base region 126. The base contact region 132 is disposed on the side of the emitter region 130.

The base contact region 132 is made of $p^+$-type SiC. The base contact region 132 includes, for example, aluminum (Al) as the p-type impurity. A concentration of the p-type impurity of the base contact region 132 is, for example, from $1\times10^{18}$ $cm^{-3}$ to $1\times10^{21}$ $cm^{-3}$.

A depth of the base contact region 132 is shallower than that of the base region 126 and is, for example, from 0.2 μm to 0.4 μm.

The gate insulating film 116 is formed on the surface of the drift region 124 and the base region 126. The gate insulating film 116 is implemented by, for example, a silicon oxide film or a high-k insulating film.

The gate electrode 118 is disposed on the gate insulating film 116. The gate electrode 118 is made of 3C—SiC including the p-type impurity. The gate electrode 118 is made of polycrystalline 3C—SiC. The gate electrode 18 may have a layered structure, as in the second embodiment, of, for example, an Al-doped polycrystal 3C—SiC, and a metal, such as TiN.

The p-type impurity included in the gate electrode 118 is aluminum (Al), gallium (Ga), or indium (In). From the viewpoint of metallizing the gate electrode 118, the concentration of the p-type impurity of the gate electrode 118 is preferably equal to or more than $1\times10^{19}$ $cm^{-3}$ and, more preferably, equal to or more than $1\times10^{20}$ $cm^{-3}$. It is further preferable that the concentration of the p-type impurity in the gate electrode 18 is equal to or more than $1\times10^{21}$ $cm^{-3}$.

The interlayer insulating film 120 is disposed on the gate electrode 118. The interlayer insulating film 120 is, for example, a silicon oxide film.

The base region 126 disposed between the emitter region 130 and the drift region 124 under the gate electrode 118 functions as the channel region of the IGBT 400.

The emitter electrode 112 is disposed on the surface of the SiC substrate 110. The emitter electrode 112 is electrically connected to the emitter region 130 and the base contact region 132. The emitter electrode 112 also functions to provide a potential to the base region 126.

The emitter electrode (metal layer) 112 is made of metal. The metal that forms the emitter electrode 112 is, for example, has a layered structure of, for example, titanium (Ti) and aluminum (Al). The metal that forms the emitter electrode 112 may react with the SiC substrate 110 to form metal silicide or metal carbide.

The collector electrode 114 is disposed on the backside of the SiC substrate 110. The collector electrode 114 is electrically connected to the collector region 122.

The collector electrode 114 is made of metal. The collector electrode 114 is formed by, for example, a metal, such as titanium aluminum alloy (TiAl).

According to the present embodiment, the IGBT 400 having a high threshold voltage is realized according to the effect similar to the effect of the first embodiment. Further, the IGBT 400 whose characteristics do not change largely and having the improved reliability is realized according to the effect similar to the effect of the first embodiment.

In the first embodiment, the example of forming 3C—SiC as the gate electrode by the CVD has been described. In the second embodiment, the example of forming the gate electrode 18 by carbonization of the silicon film has been described. The gate electrode may also be formed by sputtering using the target SiC including the p-type impurity and crystallization annealing at a temperature of equal to or less than 1,200° C. The gate electrode may also be formed by ion implantation of the p-type impurity into 3C—SiC that has been deposited by the CVD, and activation annealing at a temperature of equal to or less than 1,200° C. From the viewpoint of suppressing the occurrence of the crystal form other than 3C—SiC, it is preferable to use the manufacturing method according to the first or second embodiment.

In the first to fourth embodiments, the example of the SiC substrate made of 4H—SiC has been described, but other crystal forms, such as 3C—SiC, 6H—SiC, or the like may also be used. From the viewpoint of realizing a high breakdown voltage device, it is preferable to use 4H—SiC having a large band gap energy as the SiC substrate. From the viewpoint of increasing the threshold voltage, it is preferable to use 4H—SiC having a large band gap energy as the SiC substrate.

In the first to fourth embodiments, the example of using nitrogen (N) as the n-type impurity has been described, but phosphorus (P), arsenic (As), antimony (Sb), or the like may also be used, instead of nitrogen (N).

While certain embodiments have been described, these embodiments have been presented by way of example only, and are not intended to limit the scope of the inventions. Indeed, a semiconductor device and a method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a p-type SiC region, the p-type SiC region being 4H—SiC;
a gate electrode including a SiC layer and a metal layer disposed on the SiC layer, the SiC layer including a p-type impurity, 3C—SiC, and 4H—SiC; and
a gate insulating film disposed between the p-type SiC region and the gate electrode.

2. The device according to claim 1, wherein
the gate electrode includes the p-type impurity and the 3C—SiC at least in a region contacting the gate insulating film.

3. The device according to claim 1, wherein
the p-type impurity is aluminum (Al), gallium (Ga), or indium (In).

4. The device according to claim 1, wherein
the 3C—SiC is metalized 3C—SiC.

5. The device according to claim 1, wherein
a volume of the 3C—SiC in the gate electrode is larger than a volume of the 4H—SiC in the gate electrode.

6. The device according to claim 1, wherein
a ratio of occupation volume of 3C—SiC among all SiC included in the gate electrode is equal to or more than 90%.

7. The device according to claim 1, wherein
a concentration of the p-type impurity in the gate electrode is equal to or more than $1\times10^{20}$ cm$^{-3}$.

8. The device according to claim 1, wherein
a concentration of a p-type impurity in the p-type SIC region is equal to or less than $1\times10^{18}$ cm$^{-3}$.

9. The device according to claim 1, wherein
the gate insulating film is a silicon oxide film.

10. A semiconductor device, comprising:
a p-type SiC region, the p-type SiC region being 4H—SiC;
a gate electrode including a p-type impurity, 3C—SiC, and 4H—SiC; and
a gate insulating film disposed between the p-type SiC region and the gate electrode,
wherein the gate electrode is formed under a temperature of equal to or more than 1,000° C. and equal to or less than 1,200° C.

11. The device according to claim 10, wherein
the gate electrode is formed by a carbonization of a silicon film.

12. The device according to claim 11, wherein
the carbonization of the silicon film is performed in an atmosphere including at least one of ethane ($C_2H$), ethylene ($C_2H_6$), or acetylene ($C_2H_2$).

* * * * *